United States Patent
Yamano et al.

(10) Patent No.: US 7,312,536 B2
(45) Date of Patent: Dec. 25, 2007

(54) SUBSTRATE HAVING A BUILT-IN CHIP AND EXTERNAL CONNECTION TERMINALS ON BOTH SIDES AND A METHOD FOR MANUFACTURING THE SAME

(75) Inventors: Takaharu Yamano, Nagano (JP); Tadashi Arai, Nagano (JP); Yoshihiro Machida, Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 179 days.

(21) Appl. No.: 11/224,821

(22) Filed: Sep. 13, 2005

(65) Prior Publication Data

US 2006/0087045 A1 Apr. 27, 2006

(30) Foreign Application Priority Data

Oct. 22, 2004 (JP) ............... 2004-308558

(51) Int. Cl.
*H01L 23/28* (2006.01)

(52) U.S. Cl. ............. 257/787; 257/788; 257/789; 257/793; 257/795; 257/E23.119; 257/E23.121

(58) Field of Classification Search ........ 257/787–796, 257/E21.503, E23.001–E23.194, 678–733
See application file for complete search history.

(56) References Cited

U.S. PATENT DOCUMENTS

| | | | | |
|---|---|---|---|---|
| 5,656,250 A | * | 8/1997 | Tanaka et al. | 423/335 |
| 6,166,433 A | * | 12/2000 | Takashima et al. | 257/702 |
| 6,255,739 B1 | * | 7/2001 | Adachi et al. | 257/788 |
| 2004/0071805 A1 | * | 4/2004 | Boyaud et al. | 425/116 |
| 2004/0113215 A1 | * | 6/2004 | Shimada et al. | 257/414 |

FOREIGN PATENT DOCUMENTS

JP 2001 217381 8/2001

* cited by examiner

*Primary Examiner*—Jasmine Clark
(74) *Attorney, Agent, or Firm*—Ladas & Parry LLP

(57) ABSTRACT

A disclosed substrate having a built-in semiconductor chip includes the built-in semiconductor chip, a resin member having the built-in semiconductor chip contained therein and external connection terminals. The resin member contains a resin and 60 to 90% by weight of spherical filler.

5 Claims, 18 Drawing Sheets

SUBSTRATE HAVING A BUILT-IN CHIP AND EXTERNAL CONNECTION TERMINALS ON BOTH SIDES AND A METHOD FOR MANUFACTURING THE SAME

BACKGROUND OF THE INVENTION

1. Field of the Invention

The present invention generally relates to a substrate having a built-in chip and external connection terminals on both sides, and a method for manufacturing the same, and more particularly relates to a substrate having a built-in semiconductor chip wherein a resin member has the semiconductor chip contained therein.

2. Description of the Related Art

In these years, the semiconductor chip is becoming denser to a large extent, thus the size of the semiconductor chip becomes smaller. As the size becomes smaller, a substrate wherein a semiconductor chip is embedded, in other words, a substrate having a built-in chip is proposed.

FIG. 1 is a diagram showing a conventional substrate having a built-in chip. As shown in FIG. 1, the substrate having a built-in chip is composed of a support board 11, the built-in semiconductor chip 13, a resin member 17, vias 18, wirings 19, external connection terminals 20, a solder resist 21, solder balls 22, and a resin layer 23. The built-in semiconductor chip 13 is composed of a main body 14 and electrode pads 15.

The support board 11 supports the structure (the semiconductor chip 13, resin member 17 and others) built on the surface 11a of the support board 11. The side of semiconductor main body 14 on which the electrode pads are not built is bonded to the surface 11a of the support board 11 with the adhesive 12. The resin member 17 is provided on the support board 11 so as to cover the semiconductor chip 13. Each of the vias 18 provided in the resin member 17 is connected to the corresponding electrode pad 15 and exposed from the surface 17a of the resin member 17. The wirings 19 formed on the surface 17a of the resin member 17 are respectively connected to the via 18 and external connection terminals 20.

The external connection terminals 20 provided for disposing the solder balls 22 are exposed from the solder resist 21. The solder resist 21 exposing the external connection terminals 20 is provided on the resin member 17 so as to cover the wirings 19. The solder resist 21 is provided for protecting the wiring 19 so as to prevent the solder ball 22 from contacting the wiring 19. The solder ball 22 is provided on the external connection terminal 20. The solder balls 22 are provided for connecting another substrate such as the substrate 25 having a built-in chip. The resin layer 23 is formed on the undersurface 11b of the support board 11. The resin layer 23 prevents the structure (the semiconductor chip 13, resin member 17 and others) supported by the support board 11 from being warped together with the support board 11 (See Patent Document 1, for example).

[Patent Document 1] Japanese Patent Application Laid-Open Disclosure No. 2001-217381

However, the conventional resin member 17 has a low elastic coefficient at a temperature around its glass transition temperature, and its thermal expansion coefficient is high at a temperature lower than the glass transition temperature. Thus, as described above, it is necessary to retain the support board 11 so as to support the structure (the semiconductor chip 13, the resin member 17 and others) on the support board 11 even after the substrate 10 having a built-in chip is manufactured. Moreover, it is necessary to provide the resin layer 23 on the undersurface 11b of the support board 11 so as to prevent the substrate 10 having a built-in chip from being warped due to the deformation of the resin member 17. Accordingly, it is difficult to reduce the thickness of the substrate 10 having a built-in chip, since it is necessary to provide the support board 11 and resin layer 23. Furthermore, the support board 11 and resin layer 23 are provided on one side of the resin member 17, and the external connection terminals can be connected to only the other side of the resin member 17 on which the support board 11 and resin layer 23 are not provided. It should be noted that "the glass transition temperature" is a temperature below which the elastic coefficient of resin plummets. At the glass transition temperature, the resin structure transitions from the glass state to the gummy state.

SUMMARY OF THE INVENTION

It is a general object of the present invention to provide a low-profile substrate having a built-in chip and external connection terminals on both sides so as to attach another substrate having a built-in chip and connect the other substrate, and a method for manufacturing the same that substantially obviate one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a substrate with a built-in chip and external connection terminals on both sides particularly pointed out in the specification in such full, clear, concise, and exact terms as to enable a person having ordinary skill in the art to practice the invention. To achieve these and other advantages in accordance with the purpose of the invention, the invention provides a substrate having a built-in chip comprising the built-in semiconductor chip, a resin member having the built-in semiconductor chip contained therein and external connection terminals wherein the resin member contains a resin and 60 to 90% by weight of spherical filler.

According to the above described invention, by using a resin member that contains a resin and 60 to 90% by weight of spherical filler, the following substrate having a built-in chip can be obtained wherein compared to the conventional resin member, the elastic coefficient is high at a temperature around the glass transition temperature, the thermal expansion coefficient is low at a lower temperature than the glass transition temperature, and thus the warping of the resin member is prevented. Accordingly, it is not necessary to provide a support board and a resin layer as needed for the conventional substrate having a built-in chip, and thus the thickness of the substrate having a built-in chip can be reduced. It should be noted that the "glass transition temperature" is a temperature below which the elastic coefficient of the resin plummets.

According to another aspect of the invention, the substrate having a built-in chip is composed of a resin member having an elastic coefficient of 1 GPa through 3 GPa, at a temperature around the glass transition temperature.

According to the above described invention, the warping of the resin member can be prevented by the resin member having an elastic coefficient of 1 GPa through 3 GPa which is larger than the elastic coefficient of the conventional resin member at a temperature around the glass transition temperature.

According to another aspect of the invention, the substrate having a built-in chip is composed of a resin member having a thermal expansion coefficient of about 10 ppm through 15 ppm at a lower temperature than the glass transition temperature.

According to the above described invention, the thermal expansion coefficient is kept at 10 ppm through 15 ppm, which is lower than the thermal expansion coefficient of the conventional resin members at a lower temperature than the glass transition temperature; thus the thermal deformation is kept small so as to prevent the resin member from being warped when the resin member is heated.

According to another aspect of the present invention, the substrate having a built-in chip is comprises the external connection terminals provided on both sides of the resin member.

According to the above described invention, since it is not necessary to provide the support board on the substrate having a built-in chip, the external connection terminals can be provided on both sides of the resin member. Therefore, the substrate having a built-in chip can mount another substrate having a built-in chip on one side, and be connected to a third substrate (for example, a motherboard) on the other side.

According to another aspect of the present invention, the substrate having a built-in chip is composed of the semiconductor chip having an electrode pad connected to an external connection terminal. When Al is used as a material for the electrode pad, the zincate treatment is performed on the electrode pad so as to form an Ni layer on the electrode pad.

According to the above invention, when Al is used as a material for the electrode pad, the zincate treatment is performed on the electrode pad. Accordingly, the electrode pad is protected from re-oxidation, and thus the Ni layer is easily formed on the electrode pad. The Ni layer can be used as a stopper film when an open part is formed on the electrode pad to dispose a via, and thereby, the electrode pad is prevented from being damaged.

According to another aspect of the present invention, a method for manufacturing a substrate, which substrate includes a semiconductor chip, a resin member having the semiconductor chip contained therein, and external connection terminals wherein the resin member contains a resin and 60 to 90% by weight of spherical filler, comprises the steps of disposing the semiconductor chip on a support board, disposing the resin member on the support board so as to cover the semiconductor chip, and removing the support board.

According to the above invention, by using a resin and 60 to 90% by weight of spherical filler, compared to the conventional resin, the elastic coefficient becomes high at a temperature around the glass transition temperature and the thermal expansion coefficient becomes low at a temperature lower than the glass transition temperature; thus the warping of the resin member is controlled and it is not necessary to dispose a support board and a resin layer. Accordingly, the thickness of the substrate having a built-in chip can be reduced.

According to another aspect of the present invention, the method for manufacturing a substrate having a built-in chip further comprises the steps of forming a penetrating via penetrating the resin member, forming a first external connection terminal on a side of the resin member wherein the first external connection terminal is electrically connected to the penetrating via, and forming a second external connection terminal on another side of the resin member wherein the second external connection terminal is electrically connected to the penetrating via.

According to the above invention, by forming the first external connection terminal electrically connected to the penetrating via on one side of the substrate having a built-in chip, and by forming the second external connection terminal electrically connected to the penetrating via on the other side of the substrate having a built-in chip, and further by mounting another substrate having a built-in chip on the substrate having a built-in chip, the substrate having a built-in chip on which another substrate having a built-in chip is mounted can be connected to a third substrate.

According to the present invention, the substrate having a built-in chip and the method for manufacturing the substrate can be obtained wherein the thickness of the substrate having a built-in chip is reduced, and another substrate having a built-in chip is mounted on the substrate having a built-in chip, and thereby, the substrate having a built-in chip can be further mounted on another substrate (for example, motherboard).

BRIEF DESCRIPTION OF THE DRAWINGS

Other objects and further features of the present invention will be apparent from the following detailed description when read in conjunction with the accompanying drawings, in which.

DESCRIPTION OF THE PREFERED EMBODIMENTS

In the following, embodiments of the present invention are described with reference to the accompanying drawings.

Embodiment

Figure 1:
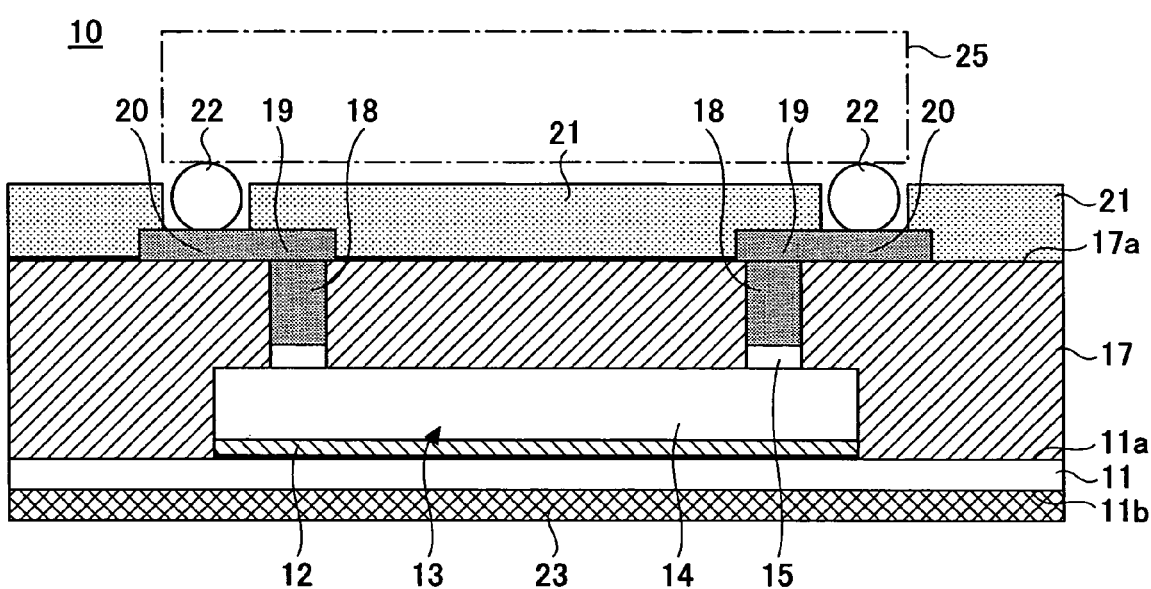
FIG. 1 is a diagram showing a substrate having a built-in chip.
Figure 2:
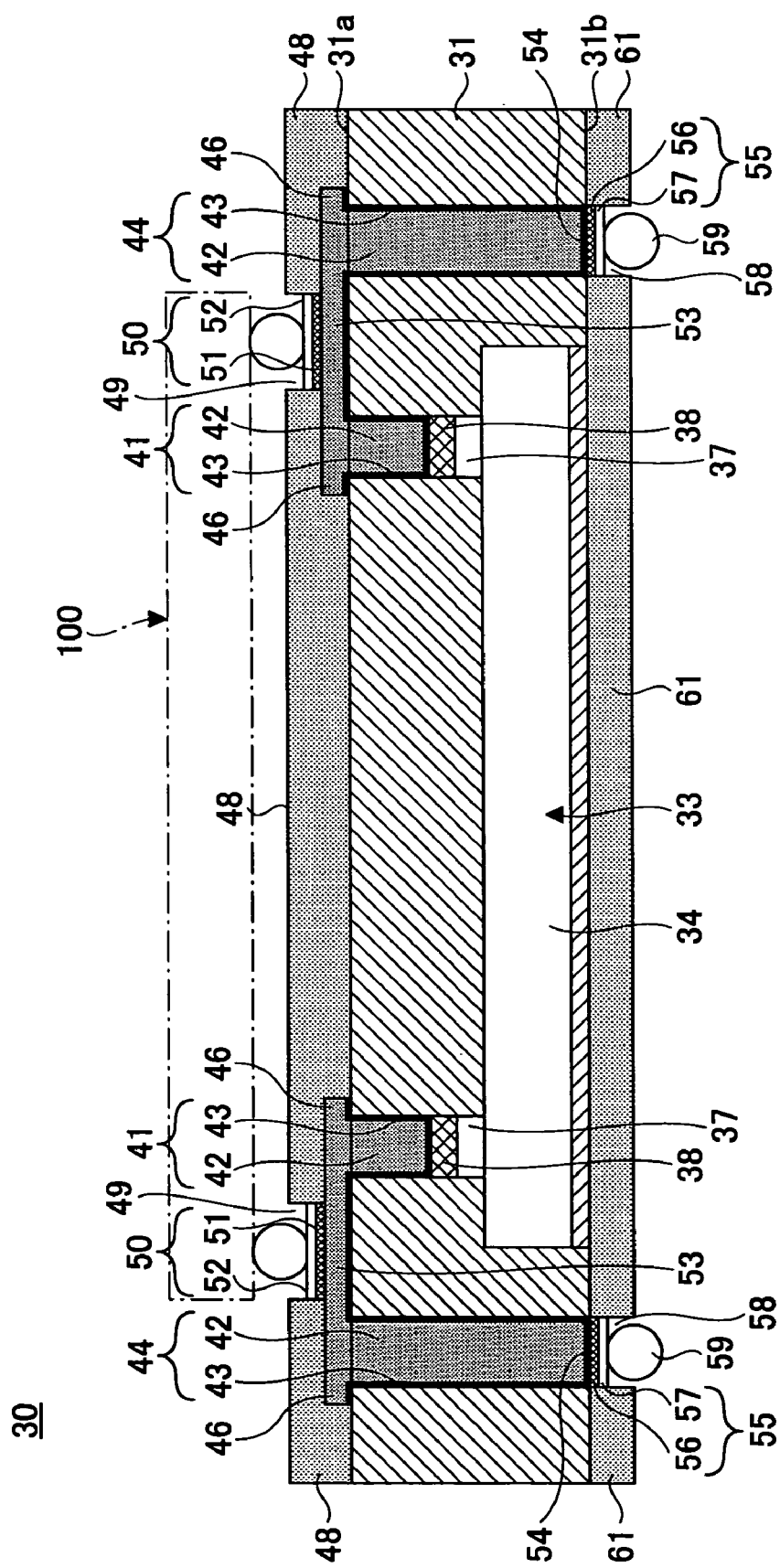
FIG. 2 is a cross-sectional diagram of the substrate having a built-in chip according to an embodiment of the present invention.

First, a detailed description is given with reference to FIG. 2 of the substrate 30 having a built-in chip according to the embodiment of the present invention. FIG. 2 is a cross-sectional diagram of the substrate having the built-in chip according to the embodiment of the present invention. The substrate 30 having the built-in chip is composed of the semiconductor chip 33, resin member 31, vias 41, penetrating vias 44, wirings 46, solder resists 48 and 61, Ni/Au layers 50 and 55, first external connection terminals 53, second external connection terminals 54, and solder balls 59.

The semiconductor chip 33 is composed of a semiconductor chip main body 34 and electrode pads 37. The electrode pads 37 are disposed on one side of the semiconductor chip main body 34. As a material for the electrode pad 37, for example, Al is used. A Ni layer 38 is formed on the electrode pad 37. When Al is used as a material for the electrode pad 37, a zincate treatment is performed on the electrode pad 37, and after the treatment, the Ni layer 38 is formed. The Ni layer 38 functions as a stopper film so as to form an open part 71 (FIG. 5) for disposing the via 41 on the electrode pad 37. The thickness of the Ni layer 38 is, for example, 5 through 10 μm. Moreover, by disposing the Ni layer 38 on the electrode pad 37, the electrode pad 37 can be prevented from being damaged when the open part 71 is formed.

The zincate treatment is plating zinc on Al, which is easily oxidized, so as to prevent Al from being re-oxidized. Accordingly, by performing the zincate treatment on the electrode pad 37 which is composed of Al so as to prevent the electrode pad 37 from being re-oxidized, the adhesion of the metal layer (in the present embodiment, Ni layer 38) formed on the electrode pad 37 to the electrode pad 37 can be improved.

The semiconductor chip 33 shown in FIG. 2 is disposed so that the side on which the electrode pads 37 of the semiconductor chip main body 34 are attached is the upper side. Moreover, the resin member 31 covers the upper side of the semiconductor chip main body 34 (the side on which the electrode pads 37 are disposed), the lateral sides of the semiconductor chip main body 34 and the electrode pads 37.

The resin member 31 containing the semiconductor chip 33 is a base material of the substrate 30 having the built-in chip. The resin member 31 is composed of a resin and 60 through 90% by weight of the spherical filler. As a material for the spherical filler, for example, $SiO_2$ can be used. The diameter of the spherical filler material is, for example, 1 through 5 μm. As a resin mixed with the spherical filler, for example, epoxy resin, mixture resin comprising epoxy resin and polyamide-imide (PAI) resin, and polyamide-imide (PAI) resin can be used.

Figure 5:
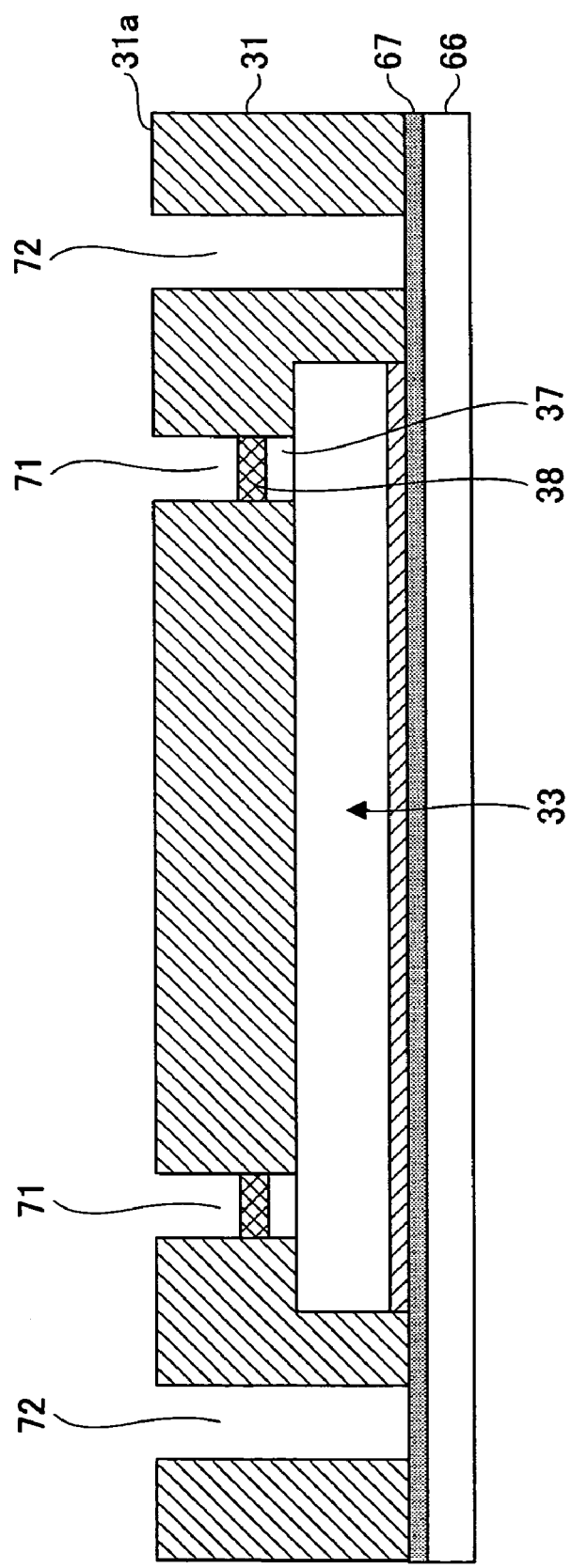
FIG. 5 is a diagram showing a manufacturing process of the substrate having a built-in chip of the embodiment of the present invention.

Accordingly, by using the resin member 31 with 60 through 90% by weight of the spherical filler, compared to the conventional resin member 17, the elastic coefficient becomes high at a temperature around a glass transition temperature and the thermal expansion coefficient becomes low at a temperature lower than the glass transition temperature, thus the warping of the resin member 31 is controlled and it is not necessary to dispose a support board 11 and a resin layer 23 which are needed for the conventional substrate 10 having a built-in chip. Accordingly, the thickness of the substrate 30 having the built-in chip can be reduced. Moreover, as the resin is highly filled with the spherical filler, the fluidity of the resin member 31 and the surface smoothness of the resin member 31 after being hardened are improved, there is no space between the semiconductor chip 33 and the resin member 31, and thus the semiconductor chip 33 can be precisely embedded in the resin member 31. Furthermore, when forming an open part 71 (as shown in FIG. 5) on the resin member 31 for forming the via 41, and when forming a through-hole 72 (as shown in FIG. 5) on the resin member 31 for forming the penetrating via 44, laser and etching processing have improved machining accuracy for the open part 71 and the through-hole 72.

By keeping the elastic coefficient of the resin member 31 at a temperature around the glass transition temperature in the range 1 GPa through 3 GPa (the elastic coefficient of the conventional resin member at a temperature around the glass transition temperature is less than 1 GPa), when the substrate having a built-in chip is acted on by an external force, the substrate having a built-in chip can be prevented from being deformed (including being warped).

By keeping the thermal expansion coefficient of the substrate having a built-in chip at a temperature lower than the glass transition temperature in the range 10 ppm through 15 ppm (the thermal expansion coefficient of the conventional resin member 17 at a temperature lower than the glass transition temperature is about 100 ppm, and the dispersion can be seen in the respective X, Y, Z directions), in the manufacturing process of the substrate 30 having a built-in chip, when the thermal treatment is performed on the substrate 30 having a built-in chip, the substrate 30 having a built-in chip can be prevented from undergoing heat deformation (including being warped). Moreover, compared to the conventional resin member 17, the dispersion of the thermal expansion coefficient of the resin member 31 in the X, Y, Z directions can be reduced. It should be noted that the word "ppm" is an abbreviation for "parts per million".

According to the present embodiment, epoxy resin is used as a resin, and $SiO_2$ is used as a spherical filler, and thereby, the resin member 31 is composed of the epoxy resin and 85% by weight of $SiO_2$ as a spherical filler, and thus the elastic coefficient and the thermal expansion coefficient are measured. As a result, the elastic coefficient (the temperature when being measured is 230° C.) of 2 GPa and the thermal expansion coefficient of 12 ppm are obtained. It should be noted that a dynamic visco-elasticity measuring apparatus (DMA) is used for measuring the above elastic coefficient, and a thermo-mechanical analyzing apparatus (TMA) is used for measuring the thermal expansion coefficient (the temperature when being measured is 210° C.). Moreover, the glass transition temperature of the resin member 31 used for being measured is 215° C., and in this case, "a temperature around a glass transition temperature" is 200 through 215° C.

According to the above measured result, by using the resin member 31 of the present embodiment, the elastic coefficient can be increased at a temperature around the glass transition temperature to be larger than the elastic coefficient of the conventional resin member 17, and the thermal expansion coefficient can be reduced at a temperature lower than the glass transition temperature to be lower than the thermal expansion coefficient of the conventional resin member 17.

The via 41 disposed in the resin member 31 is composed of a seed layer 43 and Cu layer 42. As the seed layer 43, for example, a Cu layer formed by the electroless plating method and the CVD method can be used. Moreover, as for the Cu layer 42, for example, the Cu layer 42 can be formed by the electroless plating method. As for the via 41, one edge of the via 41 is electrically connected to the electrode pad 37 via the Ni layer 38, and the other edge of the via 41 is connected to the wiring 46.

The penetrating via 44 for penetrating the resin member 31 is composed of the seed layer 43 and Cu layer 42. The edge of the penetrating via 44 exposed from the upper surface 31a of the resin member 31 is connected to the wiring 46.

The wiring 46 connects the via 41 and the penetrating via 44 through the first external connection terminal 53. The first external connection terminal 53 is electrically connected to the via 41 and the penetrating via 44 through the wiring 46. The first external connection terminal 53 unified with the wiring 46 is, for example, composed of a Cu layer.

The solder resist 48 having an open part 49 exposing the first external connection terminal 53 is disposed so as to cover the upper surface 31a of the resin member 31 and the wirings 46. The solder resist 48 functions as protection for the wirings 46.

The Ni/Au layer 50 provided on the first external connection terminal 53 is composed of Ni layer 51 and Au layer 52. The Ni/Au layer 50 prevents the Cu contained in the first external connection layer 53 from diffusing and improves the adhesion to the solder ball 59 (drawing is omitted). The Ni/Au layer 50 is connected to another substrate 100 having a built-in chip. The thickness of the Ni layer 51 is, for example, 3 μm, and the thickness of the Au layer 52 is, for example, 0.1 μm. Moreover, the Au layer 52 and the Ni layer 51 can be formed by, for example, the electroless plating method.

As described above, the substrate 30 having a built-in chip according to the present embodiment uses the resin member 31 wherein the resin member 31 is highly filled with the spherical filler, the elastic coefficient at a temperature around the glass transition temperature is high, and the thermal expansion coefficient at a temperature lower than the glass transition temperature is low. Thus, it is not necessary to dispose the support board on the substrate 30 having a built-in chip (drawing is omitted) supporting the resin member 31 containing the semiconductor chip 33 therein. Accordingly, as shown in FIG. 2, the edge of the penetrating via 44 exposed from the undersurface 31b of the resin member 31 can be connected to a solder ball 59. The edge of the penetrating via 44 exposed from the undersurface 31b of the resin member 31 is the second external connection terminal 54. The external connection terminal 54 is to be connected to another substrate such as a motherboard through the solder ball 59.

Accordingly, in the substrate 30 having a built-in chip, the first external connection terminal 53 is disposed on the upper surface 31a of the resin member 31 (one side of the resin member 31), and the second external connection terminal is disposed on the undersurface 31b of the resin member 31 (the other side of the resin member 31), thus the other substrate 100 having a built-in chip is mounted on the substrate 30 having a built-in chip, and the substrate 30 having a built-in chip mounting the other substrate 100 having a built-in chip can be connected to another substrate (for example, a motherboard).

The solder resist 61 having an open part 58 exposing the second external connection terminal 54 is disposed so as to cover the undersurface 31b of the resin member 31 and the under edge of the semiconductor chip 33. A Ni/Au layer 55 provided on the second external connection terminal 54 is composed of Ni layer 56 and Au layer 57. The Ni/Au layer 55 prevents the Cu contained in the second external connection terminal 54 from diffusing into the solder ball 59 and improves the adhesion toward the solder ball 59. The solder ball 59 is connected to the Au layer 57. The thickness of the Ni layer 56 is, for example, 3 μm, and the thickness of the Au layer 57 is, for example, 0.1 μm. Moreover, the Ni layer 56 and the Au layer 57 can be formed by, for example, the electroless plating method.

As described above, by using the resin member 31 with 60 through 90% by weight of the spherical filler, compared to the conventional resin member 17, the elastic coefficient becomes high at a temperature around a glass transition temperature, and the thermal expansion coefficient becomes low at a temperature lower than the glass transition temperature, and thereby, the thickness of the substrate 30 having a built-in chip can be reduced. Moreover, the first external connection terminal 53 is provided on the upper surface 31a of the resin member 31 (one side of the resin member 31), and the second external connection terminal is disposed on the undersurface 31b of the resin member 31 (the other side of the resin member 31); thus the other substrate 100 having a built-in chip is mounted on the substrate 30 having a built-in chip, and the substrate 30 having a built-in chip mounting the other substrate 100 having a built-in chip can be connected to another substrate (for example, a motherboard).

Next, a detailed description is given of a method for manufacturing the substrate 30 having a built-in chip with reference to FIGS. 3 through 18. FIGS. 3 through 18 are diagrams showing a manufacturing process of the substrate having a built-in chip of the embodiment of the present invention.

Figure 3:
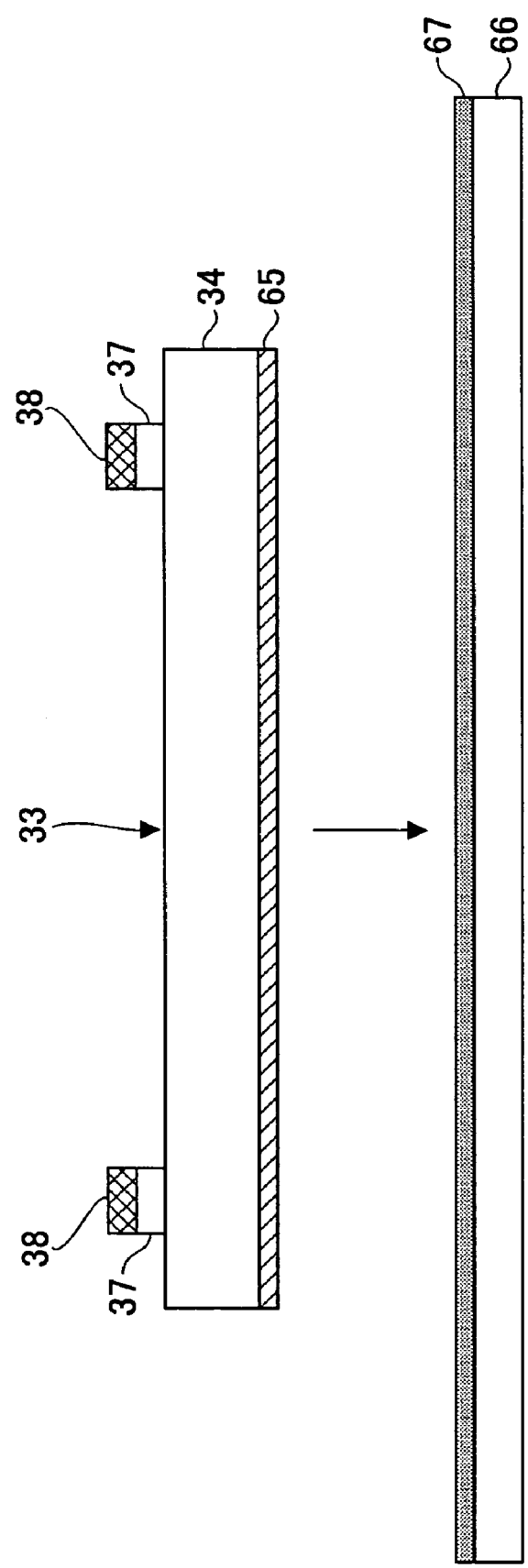
FIG. 3 is a diagram showing a manufacturing process of the substrate having a built-in chip of the embodiment of the present invention.

First, as shown in FIG. 3, on the electrode pad 37 (Al is used as a material) on which the zincate treatment is performed in advance, the Ni layer 38 is formed. The zincate treatment is performed on the electrode pad 37 which is composed of Al, and thereby, the electrode pad is protected from re-oxidation so as to improve the adhesion between the electrode pad 37 and the metal layer formed on the electrode pad 37 (in the present embodiment, Ni layer 38). The Ni layer 38 functions as a stopper film when forming an open part 71 in the resin member 31 by laser processing for disposing the via 41.

After the above described process, the adhesive 65 is spread on the side of the semiconductor chip main body 34 where the electrode pads 37 are not disposed, and the semiconductor chip 33 is bonded on the support board 66 where a copper foil 67 is provided (semiconductor chip providing step). The copper foil 67 functions as a stopper film when the through-hole 72 is formed for disposing the penetrating via 44.

Figure 4:
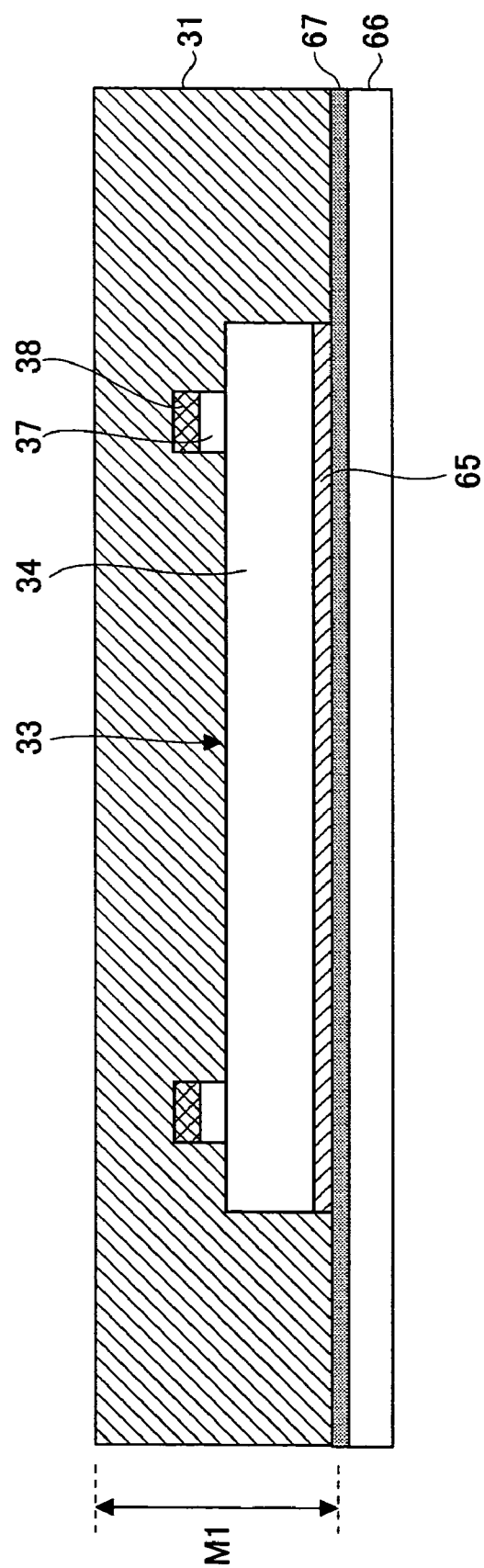
FIG. 4 is a diagram showing a manufacturing process of the substrate having a built-in chip of the embodiment of the present invention.

Next, as shown in FIG. 4, the film resin member 31 composed of the epoxy resin and 60 through 90% by weight of $SiO_2$ as the spherical filler laminates the semiconductor chip 33 disposed on the support board 66 and the copper foil 67, and according to the need, the resin member 31 is hardened by pressing and heating (the resin member providing step). The thickness M1 of the resin member 31 is, for example, 70 µm.

Next, as shown in FIG. 5, the through-hole 72 penetrating the resin member 31 and the open part 71 exposing the Ni layer 38 are formed. The open part 71 is for disposing the via 41. The through-hole 72 is for disposing the penetrating via 44. The diameter of the through-hole 72 is, for example, 50 µm. Moreover, the diameter of the penetrating via 44 is, for example, 100 µm. Furthermore, the copper foil 67 and Ni layer 38 are used as stopper layers when the open part 71 and the through-hole 72 are formed by the laser processing.

Figure 6:
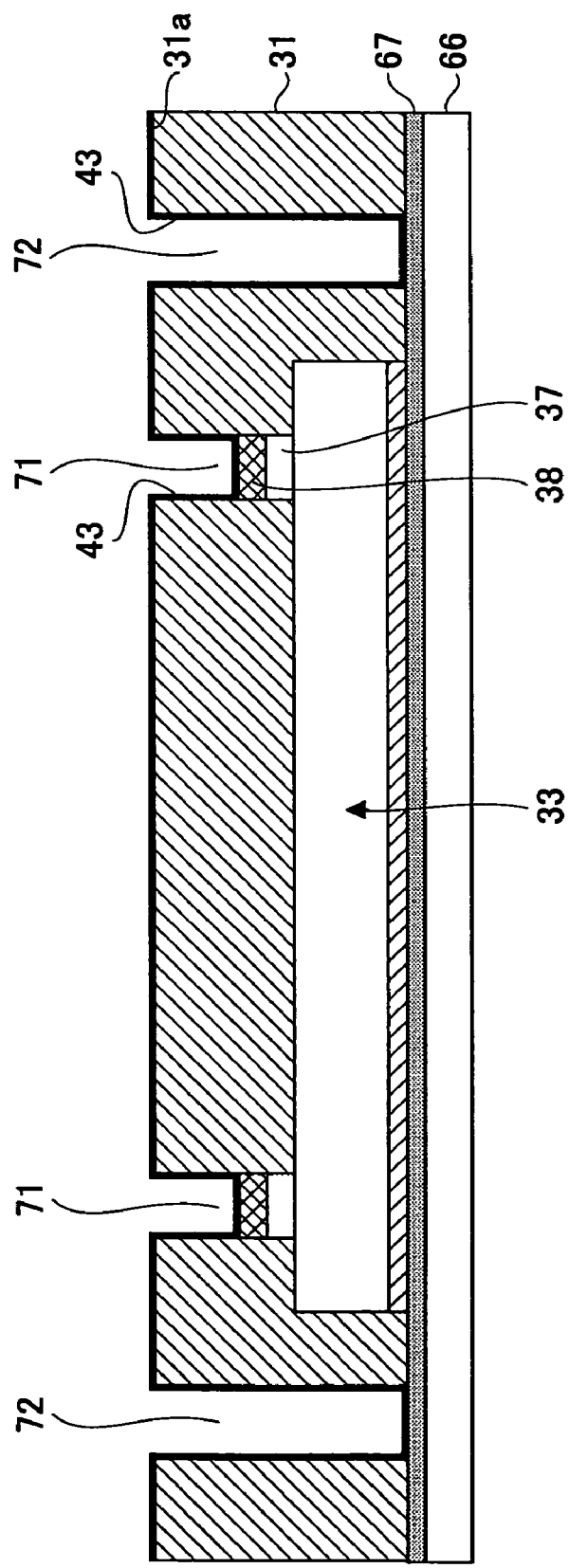
FIG. 6 is a diagram showing a manufacturing process of the substrate having a built-in chip of the embodiment of the present invention.

Next, as shown in FIG. 6, the open part 71, through-hole 72, and the seed layer 43 on the upper side 31a of the resin member 31 are formed. As the seed layer 43, for example, a Cu layer (the thickness is 1 through 2 µm) formed by the electroless plating method and CVD method can be used.

Figure 7:
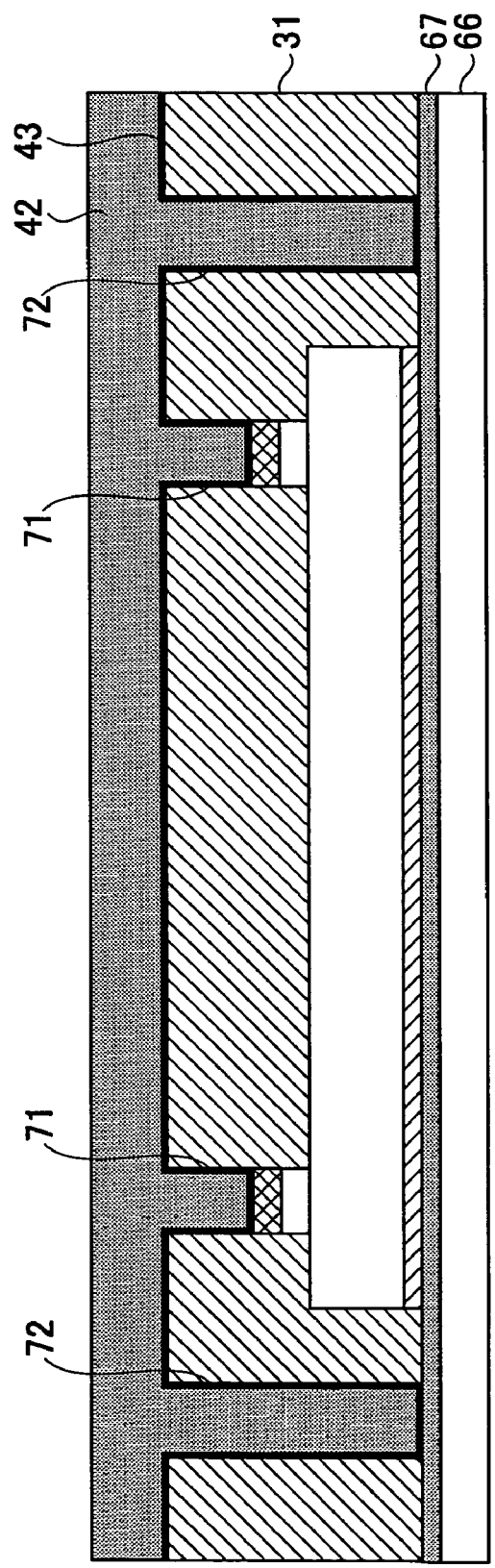
FIG. 7 is a diagram showing a manufacturing process of the substrate having a built-in chip of the embodiment of the present invention.

Next, as shown in FIG. 7, the seed layer 43 is used as a power supply, the open part 71 and the through-hole 72 are filled with the Cu layer 42 according to the electrolytic plating method. The electrolytic plating is performed twice. Accordingly, electrolytic plating is performed twice so as to prevent a void (inferior embedding) in the Cu layer 42 embedded in the open part 71 and through-hole 72.

Figure 8:
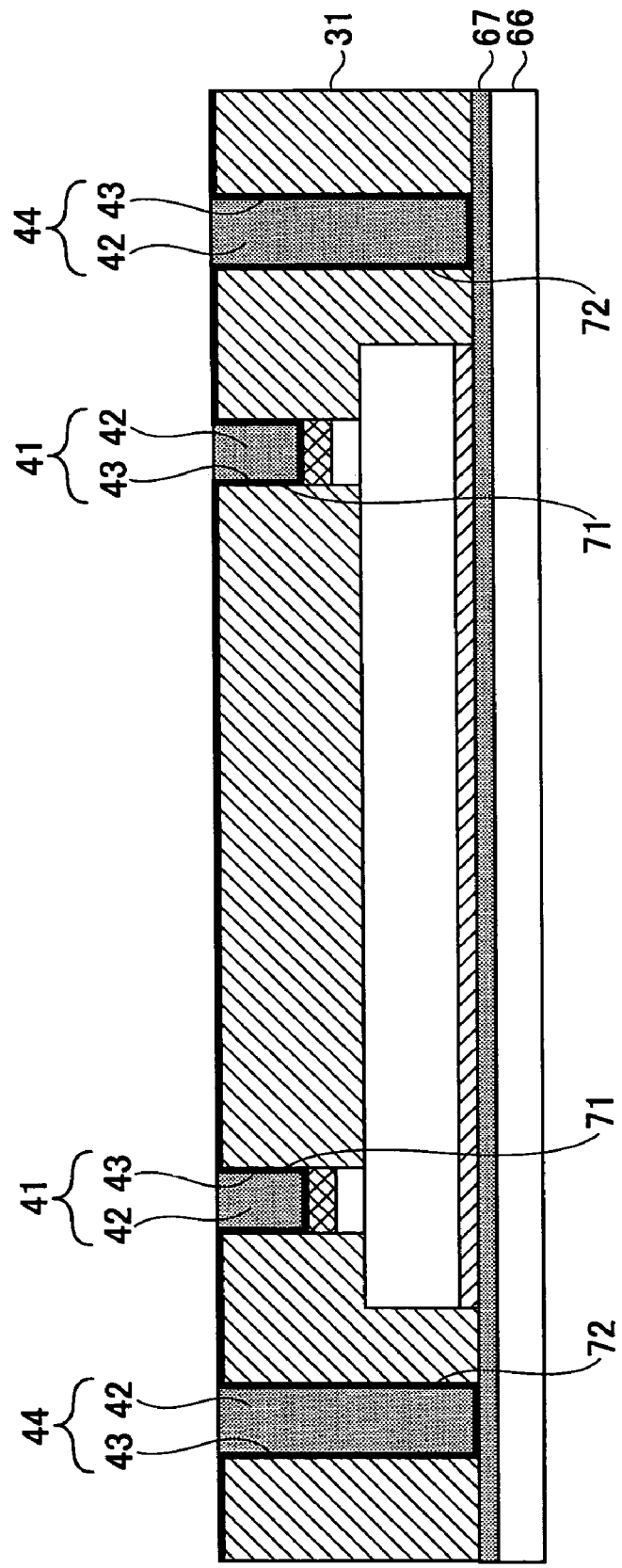
FIG. 8 is a diagram showing a manufacturing process of the substrate having a built-in chip of the embodiment of the present invention.

Next, as shown in FIG. 8, the Cu layer 42 on the resin member 31 is ground to be flat by one of a buff grinding attachment and CMP apparatus. Accordingly, the via 41 including the seed layer 43 and Cu layer 42 is formed in the open part 71, and the penetrating via 44 including the seed layer 43 and Cu layer 42 is formed in the through-hole 72 (the penetrating via forming step).

Figure 9:
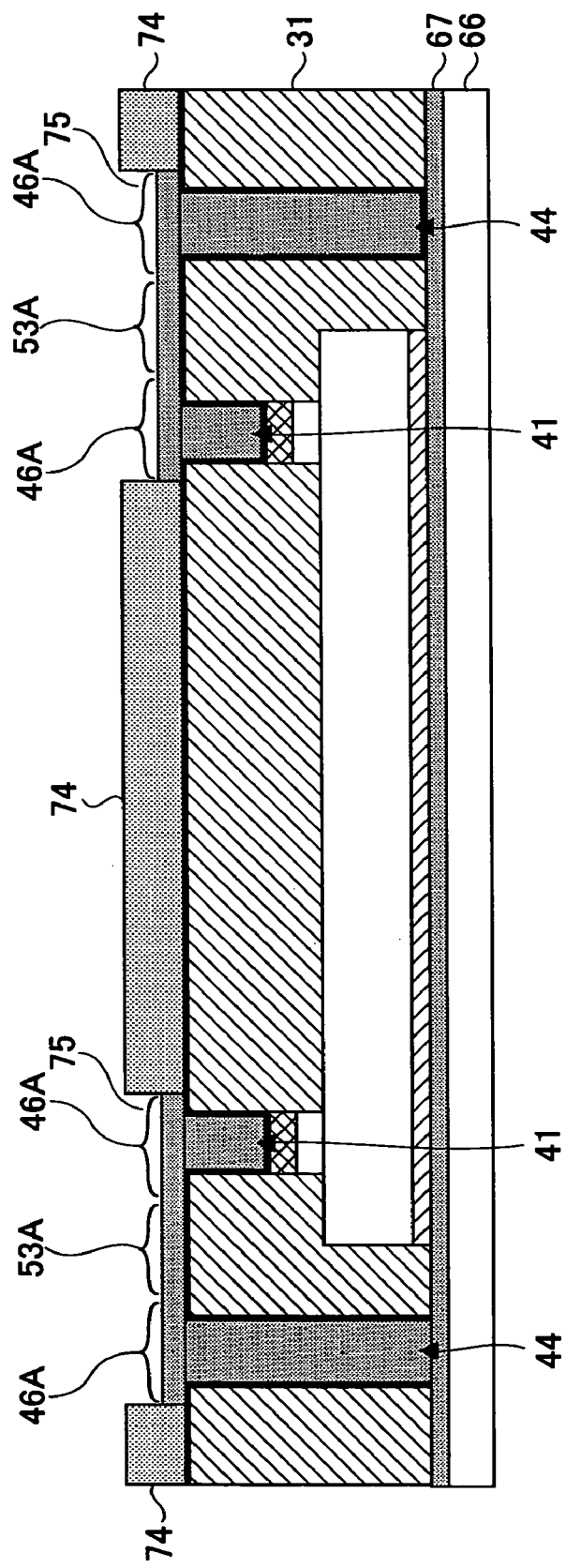
FIG. 9 is a diagram showing a manufacturing process of the substrate having a built-in chip of the embodiment of the present invention.

Next, as shown in FIG. 9, a dry film resist 74 having an open part 75 is formed on the structure shown in FIG. 8. The open part 75 exposes parts 46A where the wirings 46 are formed, and a part 53A where the first external connection terminal 53 is formed. After the dry film resist 74 is formed, by growing the layer on the open part 75 according to the electrolytic plating method, the wirings 46 are formed which are connected to the corresponding via 41 and penetrating via 44, and the first external connection terminal 53 is formed so as to be unified with the wirings 46 (the first external connection terminal forming step). After the wirings 46 and first external connection terminal 53 are formed, the dry resist film 74 is ablated by the resist ablating treatment.

Figure 10:
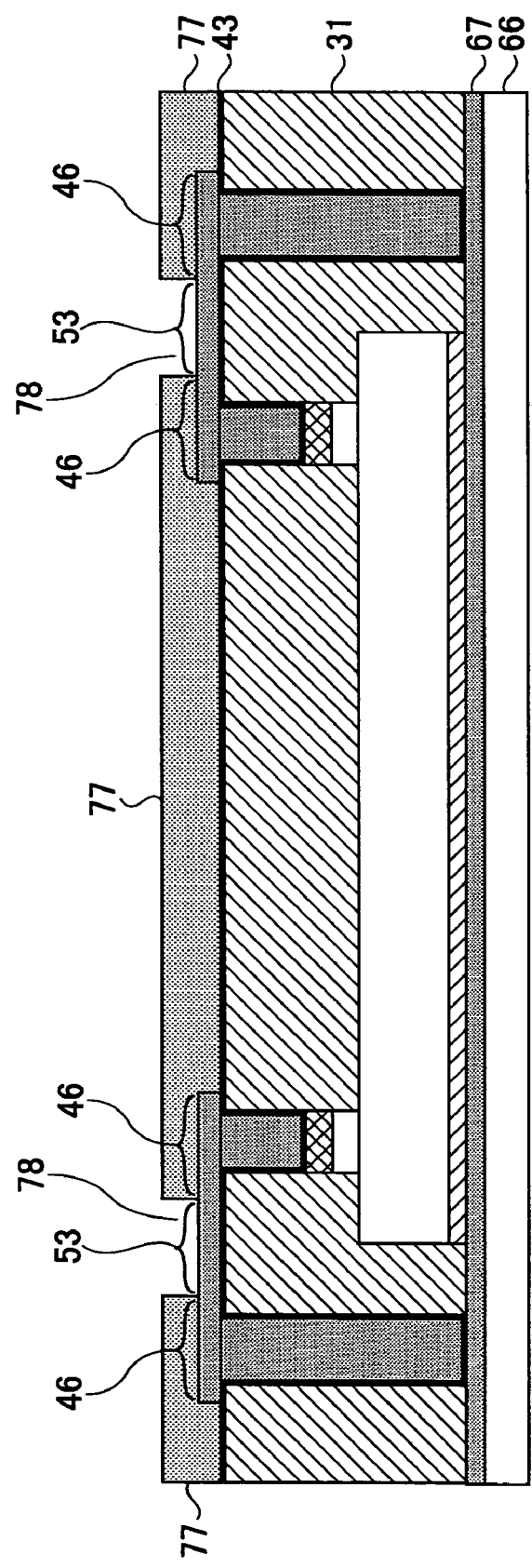
FIG. 10 is a diagram showing a manufacturing process of the substrate having a built-in chip of the embodiment of the present invention.
Figure 11:
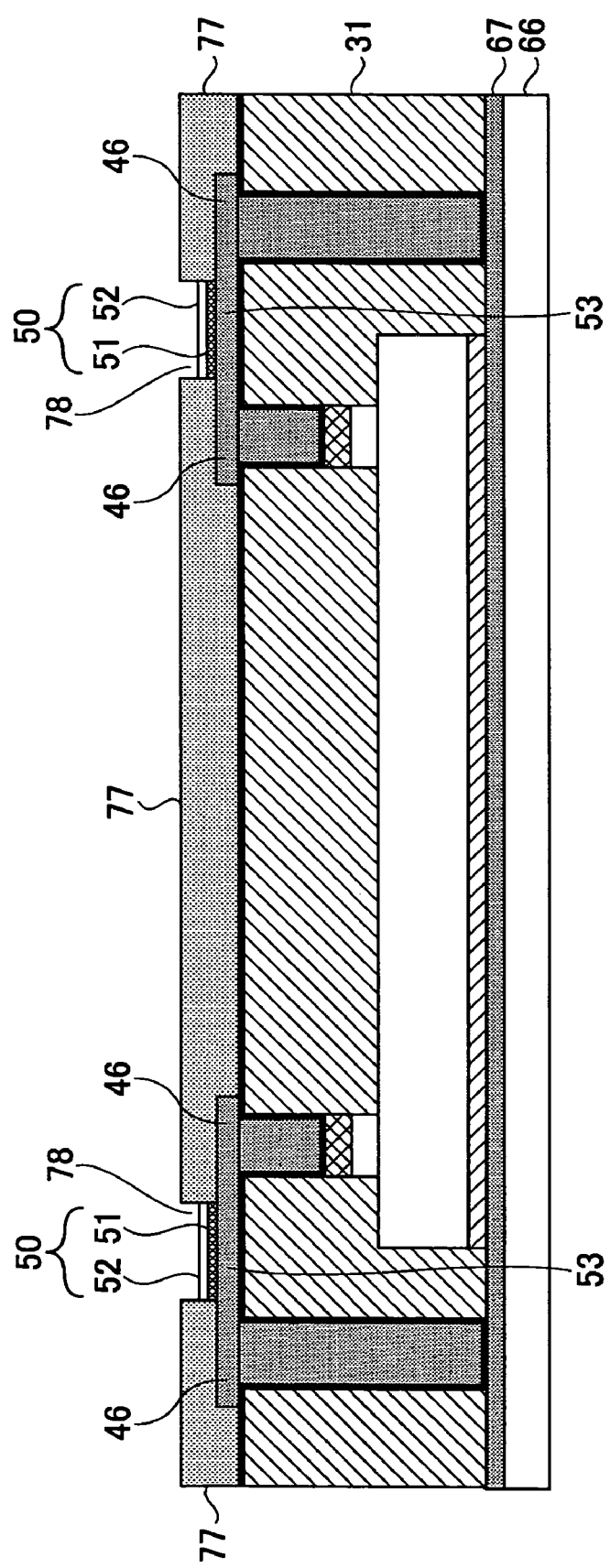
FIG. 11 is a diagram showing a manufacturing process of the substrate having a built-in chip of the embodiment of the present invention.

Next, as shown in FIG. 10, a dry film resist 77 having an open part 78 exposing the first external connection terminal 53 is provided on the seed layer 43 so as to cover the wiring 46. Then, as shown in FIG. 11, by forming a Ni layer 51 and Au layer 52 in turn on the first external connection terminal 53 exposed from the open part 78, a Ni/Au layer 50 is formed. The dry film resist 77 is ablated by the resist ablating treatment after the Ni/Au layer 50 is formed.

Figure 12:
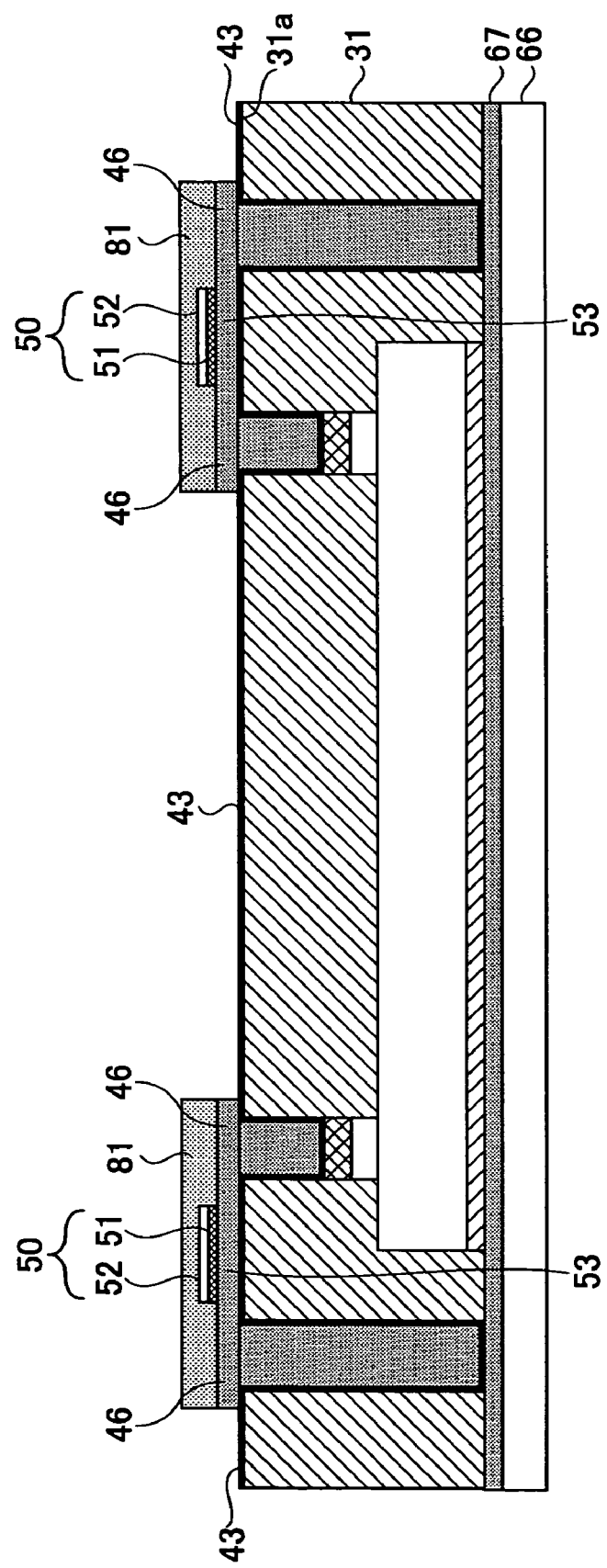
FIG. 12 is a diagram showing a manufacturing process of the substrate having a built-in chip of the embodiment of the present invention.
Figure 13:
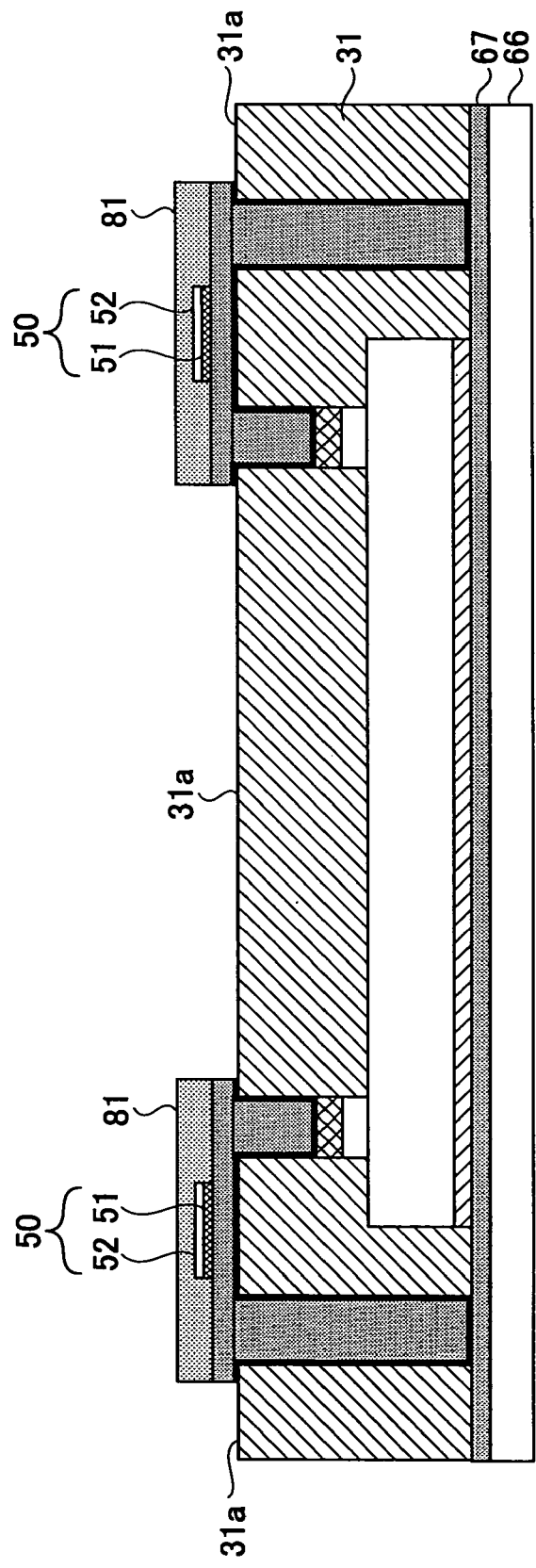
FIG. 13 is a diagram showing a manufacturing process of the substrate having a built-in chip of the embodiment of the present invention.

Next, as shown in FIG. 12, a dry film resist 81 is formed so as to cover the wiring 46 and Ni/Au layer 50. Then, as shown in FIG. 13, the seed layer 43 formed on the upper surface 31a of the resin member 31 is ablated by etching so as to expose the upper surface 31a of the resin member 31. The dry film resist 81 is ablated by the resist ablating treatment after the seed layer 43 is ablated.

Figure 14:
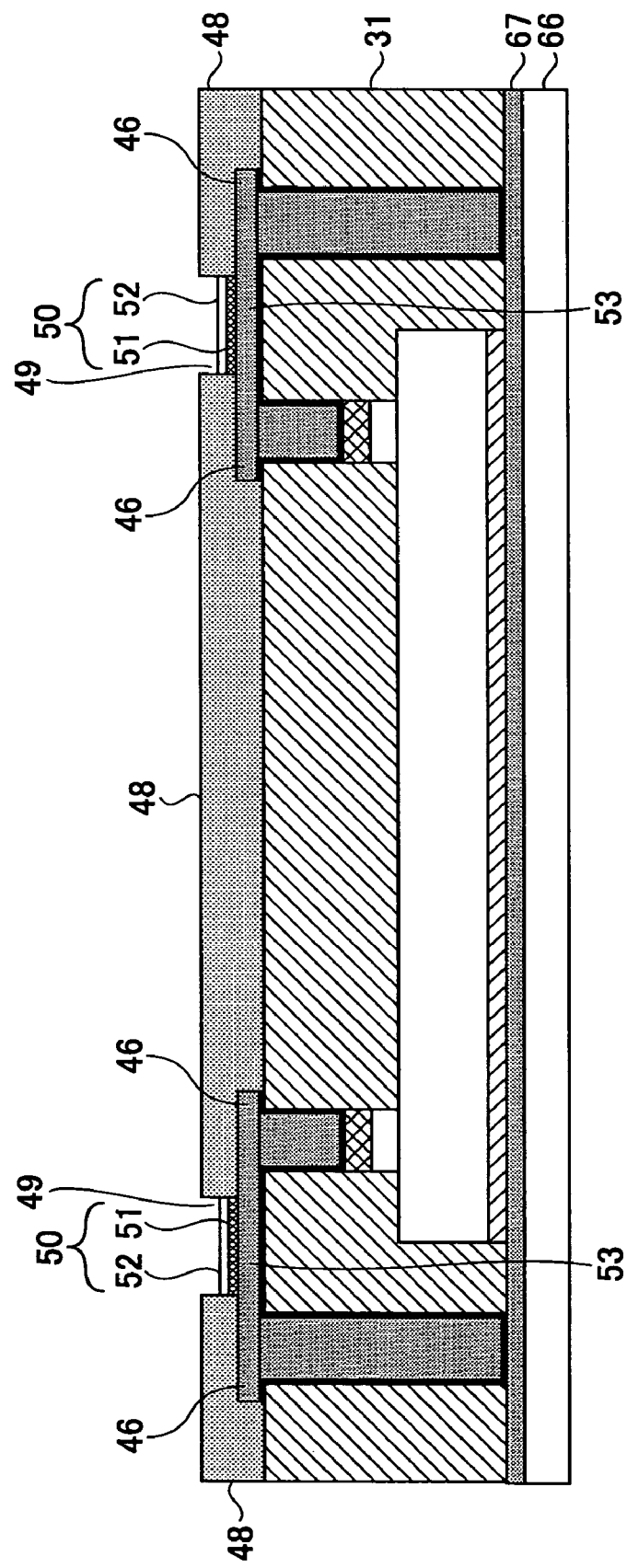
FIG. 14 is a diagram showing a manufacturing process of the substrate having a built-in chip of the embodiment of the present invention.
Figure 15:
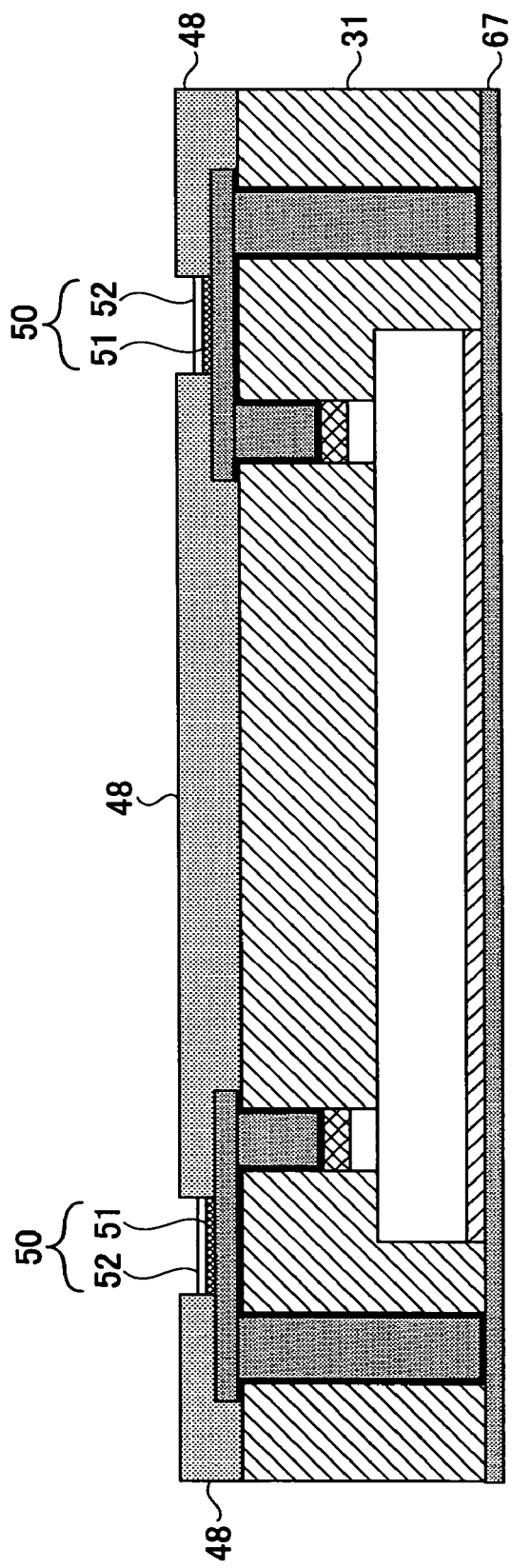
FIG. 15 is a diagram showing a manufacturing process of the substrate having a built-in chip of the embodiment of the present invention.
Figure 16:
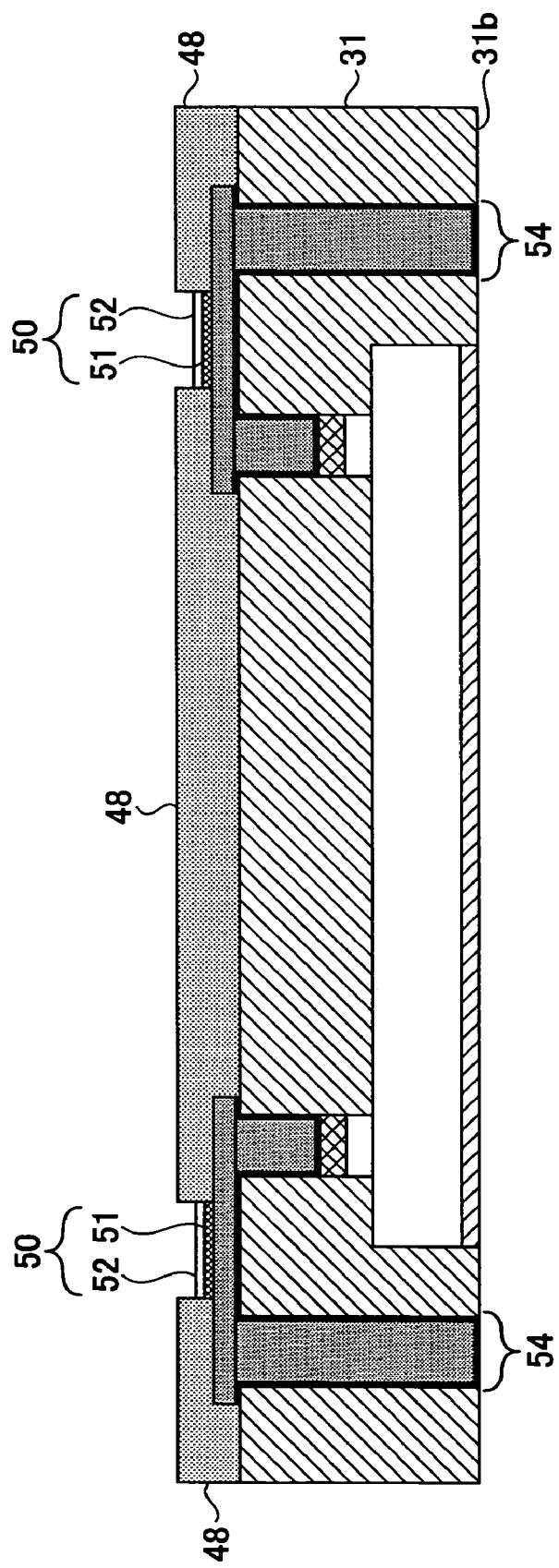
FIG. 16 is a diagram showing a manufacturing process of the substrate having a built-in chip of the embodiment of the present invention.

Next, as shown in FIG. 14, a solder resist 48 having an open part 49 exposing the Ni/Au layer 50 is formed on the wiring 46 and resin member 31. Then, as shown in FIG. 15, the support board 66 is removed (the support board removing step). The support board 66 can be removed by, for example, buff grinding. Next, as shown in FIG. 16, the copper foil 67 is removed. Accordingly, the second external connection terminal 54 and the undersurface 31b of the resin member 31 are exposed (the second external connection terminal forming step). The copper foil 67 can be removed, for example, by grinding the copper foil 67 with a CMP apparatus.

Figure 17:
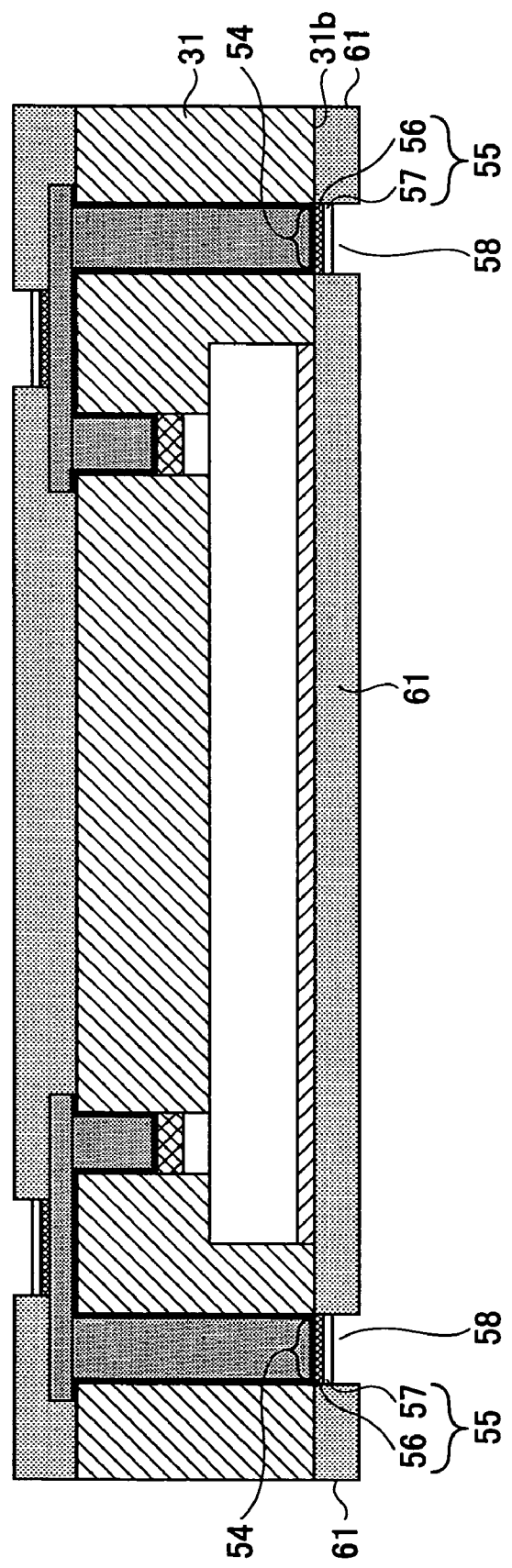
FIG. 17 is a diagram showing a manufacturing process of the substrate having a built-in chip of the embodiment of the present invention.

Next, as shown in FIG. 17, the solder resist 61 having an open part 58 exposing the second external connection terminal 54 is formed. Then, according to the electroless plating method, a Ni layer 56 and Au layer 57 are laminated in turn so as to form a Ni/Au layer 55.

Figure 18:
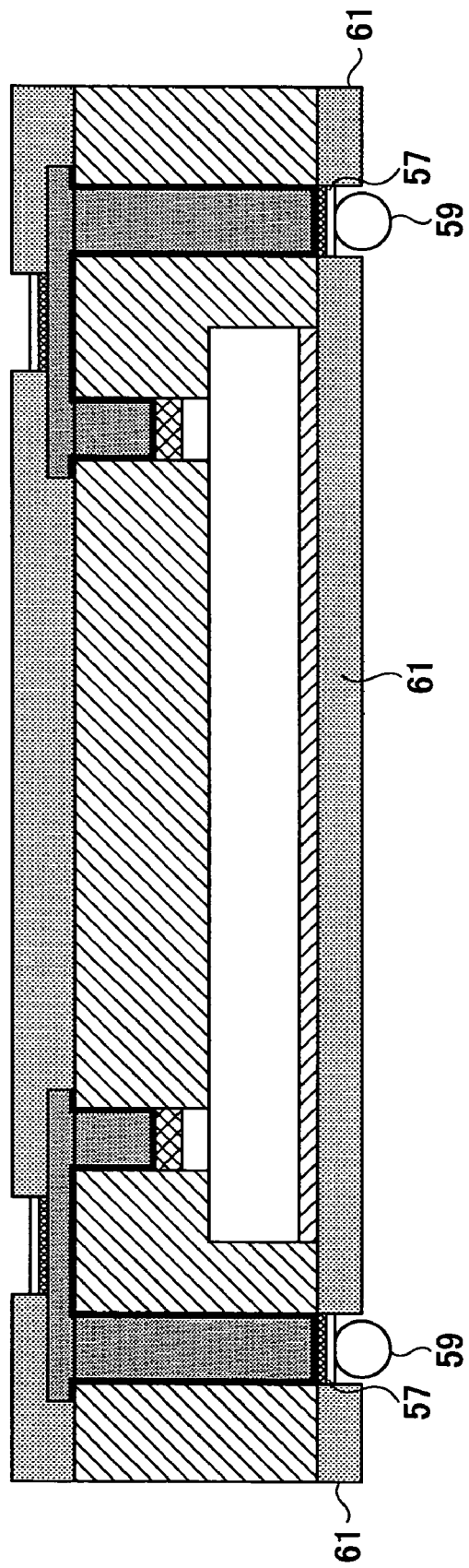
FIG. 18 is a diagram showing a manufacturing process of the substrate having a built-in chip of the embodiment of the present invention.

Accordingly, as shown in FIG. 18, by disposing the solder ball 59 on the Au layer 57, the substrate 30 having a built-in chip is manufactured. It should be noted that the substrate 30 having a built-in chip according to the present embodiment is composed of the solder ball 59 and solder resist 61; however, the use of the solder ball 59 and the solder resist 61 is optional, and thus the solder ball 59 and solder resist 61 are disposed according to the need.

As described above, by manufacturing the substrate 30 having a built-in chip with the resin member 31 which is composed of a resin and 60 through 90% by weight of the spherical filler, compared to the conventional resin member 17, the elastic coefficient at a temperature around a glass transition temperature becomes high, and the thermal expansion coefficient at a temperature lower than the glass transition temperature becomes low, and thereby, it is not necessary to dispose the support board 66 and the resin layer on the support board 66. Thus, the support board 66 can be removed so as to reduce the thickness of the substrate 30 having a built-in chip. Moreover, since it is not necessary to dispose the support board 66, it becomes possible to dispose the external connection terminals (the first and second external connection terminals 53 and 54) on both sides 31a and 31b of the resin member 31. Therefore, another substrate 100 having a built-in chip can be mounted on the substrate 30 having a built-in chip, and the substrate 30 having built-in chip mounting the other substrate 100 can be connected to another substrate (for example, a motherboard).

Further, the present invention is not limited to these embodiments, but various variations and modifications may be made without departing from the scope of the present invention. It should be noted that the open part 71 and the through-hole 72 can be formed by etching.

According to the present invention, the thickness of the substrate having a built-in chip can be reduced. Moreover the present invention can be applied to a substrate having a built-in chip which can be connected to more substrates (for example, a motherboard) than the conventional substrates can be connected by disposing external connection terminals on both sides of the resin member. The present invention can also be applied to a method for manufacturing the above described substrate.

The present application is based on Japanese Priority Application No. 2004-308558 filed on Oct. 22, 2004, with the Japanese Patent Office, the entire contents of which are hereby incorporated by reference.

What is claimed is:

1. A substrate having a built-in semiconductor chip, comprising:
   the built-in semiconductor chip;
   a resin member having said built-in semiconductor chip contained therein; and
   external connection terminals;
   wherein said resin member contains a resin and 60 to 90% by weight of spherical filler,
   said resin member having an upper principal surface and a lower principal surface,
   said external connection terminals being provided on both said upper and lower principal surfaces of said resin member,
   said upper principal surface carrying thereon a conductor pattern such that said conductor pattern is covered with a solder resist film.

2. The substrate having the built-in semiconductor chip as claimed in claim 1, wherein, said resin member has an elastic coefficient of 1 GPa to 3 GPa at a temperature around a glass transition temperature.

3. The substrate having the built-in semiconductor chip therein as claimed in claim 1, wherein said resin member has a thermal expansion coefficient of 10 ppm to 15 ppm at a temperature lower than the glass transition temperature.

4. The substrate having the built-in semiconductor chip as claimed in claim 1, wherein said external connection terminals are provided on both sides of said resin member.

5. The substrate having the built-in semiconductor chip as claimed in claim 1, wherein
   said built-in semiconductor chip has an electrode pad connected to said external connection terminal, wherein Al is used as a material for said electrode pad, a zincate treatment is performed on said electrode pad so as to form a Ni layer on said electrode pad.

* * * * *